(12) United States Patent
Park et al.

(10) Patent No.: US 10,916,728 B2
(45) Date of Patent: Feb. 9, 2021

(54) DISPLAY DEVICE

(71) Applicant: Samsung Display Co., Ltd., Yongin-Si (KR)

(72) Inventors: Gwui-Hyun Park, Hwaseong-si (KR); Jin Seock Kim, Seongnam-si (KR); Pil Soon Hong, Gwangmyeong-si (KR); Chui Won Park, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/364,266

(22) Filed: Mar. 26, 2019

(65) Prior Publication Data
US 2020/0067016 A1   Feb. 27, 2020

(30) Foreign Application Priority Data
Aug. 27, 2018   (KR) .................. 10-2018-0100270

(51) Int. Cl.
*H01L 51/52* (2006.01)
*H01L 27/32* (2006.01)

(52) U.S. Cl.
CPC ...... *H01L 51/5253* (2013.01); *H01L 27/3276* (2013.01)

(58) Field of Classification Search
CPC ............. H01L 51/5253; H01L 51/5246; H01L 27/3246; H01L 27/3276; H01L 2933/005; H01L 51/5256; H01L 27/3283; H01L 2251/5338
See application file for complete search history.

(56) References Cited

U.S. PATENT DOCUMENTS

2018/0033998 A1* 2/2018 Kim .................... H01L 51/5253
2018/0124933 A1* 5/2018 Park ....................... H01L 27/32

FOREIGN PATENT DOCUMENTS

| KR | 10-2016-0087982 A | 7/2016 |
| KR | 10-2017-0023268 A | 3/2017 |
| KR | 10-2017-0071282 A | 6/2017 |
| KR | 10-2017-0138388 A | 12/2017 |
| KR | 10-2018-0013452 A | 2/2018 |
| KR | 10-2018-0068011 A | 6/2018 |

* cited by examiner

*Primary Examiner* — Caridad Everhart
(74) *Attorney, Agent, or Firm* — Innovation Counsel LLP

(57) ABSTRACT

A display device includes: a substrate including a display area and a non-display area around the display area; a light-emitting element disposed in the display area; an encapsulating layer sealing the light-emitting element; and a dam disposed in the non-display area. The dam includes a first layer and a second layer on the first layer, the first layer includes a first portion with a first height and a second portion with a second height that is less than the first height, and the second layer covers a lateral surface of the first portion.

17 Claims, 8 Drawing Sheets

DISPLAY DEVICE

CROSS-REFERENCE TO RELATED APPLICATION

This application claims priority to and the benefit of Korean Patent Application No. 10-2018-0100270 filed in the Korean Intellectual Property Office on Aug. 27, 2018, the entire contents of which are incorporated herein by reference.

BACKGROUND

(a) Technical Field

This disclosure relates to a display device, and particularly relates to an organic light emitting device.

(b) Description of the Related Art

An organic light emitting device is manufactured by forming light emitting elements and circuit elements for driving them on a substrate. Glass is used as a substrate of the display device. However, the glass substrate is heavy and easily broken. In addition, the glass substrate is rigid, so it is difficult to deform a shape of the display device.

Recently, display devices using a flexible substrate that is light in weight, is strong against impacts, and is easy deformed have been under development. To prevent external moisture or oxygen from permeating into the display device, techniques for directly forming an encapsulation layer on the light emitting elements instead of sealing the light emitting elements with an encapsulation substrate are being developed. To prevent a material such as a monomer from overflowing to the outside of the display device when an encapsulating layer is formed, the display device may include a dam. When adhesiveness of the dam is weak, the dam may lift, and in this case, the dam may not play its role, or the dam may fall apart to contaminate other portions of the display device.

The above information disclosed in this Background section is only for enhancement of understanding of the background of the inventive concept and therefore it may contain information that does not form the prior art that is already known in this country to a person of ordinary skill in the art.

SUMMARY

Embodiments provide a display device for preventing lifting of a dam that stops a forming material of an encapsulating layer from overflowing.

An exemplary embodiment provides a display device that includes: a substrate including a display area and a non-display area around the display area; a light-emitting element disposed in the display area; an encapsulating layer sealing the light-emitting element; and a dam disposed in the non-display area.

The dam includes a first layer and a second layer on the first layer, the first layer includes a first portion with a first height and a second portion with a second height that is less than the first height, and the second layer covers a lateral surface of the first portion.

The display device may further include an inorganic insulating layer disposed between the substrate and the dam.

The first layer may contact the inorganic insulating layer, and the second layer may not contact the inorganic insulating layer.

The second portion may be positioned outside of the first portion.

The second portion may be disposed on respective sides of the first portion.

The first layer and the second layer may respectively include an organic material.

The display device may further include a first organic insulating layer disposed between the substrate and the light-emitting element, and a second organic insulating layer disposed between the first organic insulating layer and the encapsulating layer. The first layer may be formed to be a same layer with a same material as the first organic insulating layer, and the second layer may be formed to be a same layer with a same material as the second organic insulating layer The display device may further include a conductive layer disposed between the first layer and the second layer.

The display device may further include a voltage transmitting line disposed on the inorganic insulating layer in the non-display area, wherein the conductive layer may be connected to the voltage transmitting line.

The conductive layer may be in an electrically floating state.

The light-emitting element may include a first electrode, an emission layer on the first electrode, and a second electrode on the emission layer. The conductive layer may be formed to be a same layer with a same material as the first electrode.

The display device may further include an additional dam disposed between the dam and the display area. The additional dam may a portion contacting the conductive layer.

The additional dam may be formed of a same material as the second layer or a different material therefrom.

The encapsulating layer may include a first inorganic layer, a second inorganic layer, and an organic layer between the first inorganic layer and the second inorganic layer. The dam may surround the display area, and the first inorganic layer and the second inorganic layer may contact each other on the dam.

Another embodiment provides: a light-emitting element disposed in a display area; an encapsulating layer sealing the light-emitting element; a connecting member disposed in a non-display area around the display area; and a dam disposed in the non-display area, and including a first layer and a second layer on the first layer. The connecting member is disposed between the first layer and the second layer and covers an internal surface, an upper surface, and an external surface of the first layer, and the second layer covers the internal surface, the upper surface, and the external surface of the first layer.

The second layer may cover an end portion of the connecting member.

The connecting member may protrude to respective sides of the dam.

The display device may further include an inorganic insulating layer disposed between the substrate and the dam. The first layer may contact the inorganic insulating layer, and the second layer may not contact the inorganic insulating layer.

The connecting member may have a portion that is disposed between the first layer and the second layer and is discontinuously formed.

The display device may further include a voltage transmitting line disposed in the non-display area and transmitting a common voltage. The connecting member may be connected to the voltage transmitting line.

The display device may further include a first organic insulating layer disposed between the substrate and the light-emitting element, and a second organic insulating layer disposed between the first organic insulating layer and the encapsulating layer. The first layer may be is formed of a same material as the first organic insulating layer on a same plane. The second layer may be formed of a same material as the second organic insulating layer on a same plane.

According to the exemplary embodiments, it is possible to prevent the dam, which is provided for preventing the forming material of the encapsulating layer from overflowing, from lifting. Further, the effects recognizable throughout the specification may be provided.

DETAILED DESCRIPTION OF THE EMBODIMENTS

Figure 1:
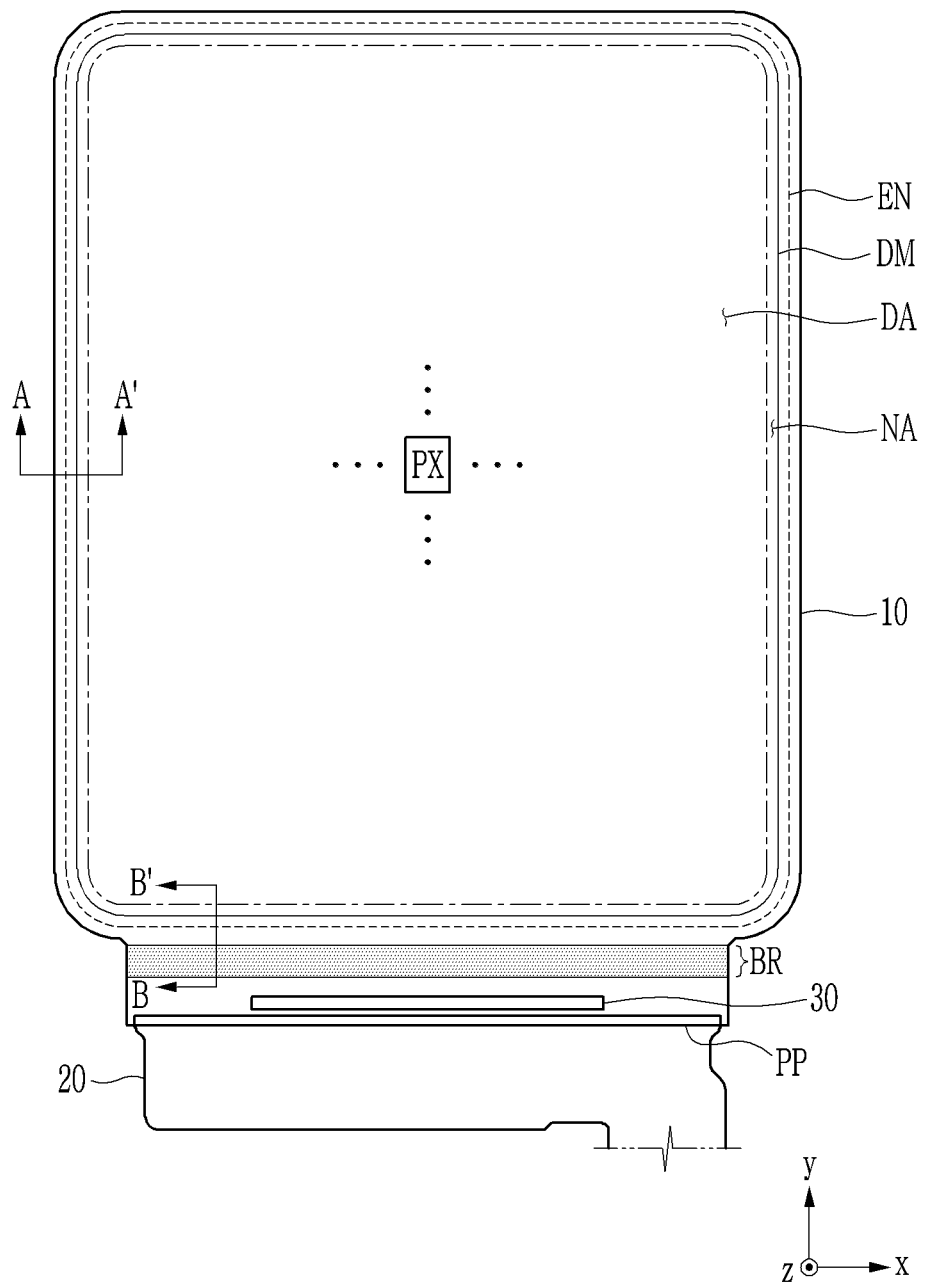
FIG. 1 shows a top plan view of a display device according to an exemplary embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present inventive concept.

Like reference numerals designate like elements throughout the specification. In the drawings, the thickness or sizes of respective layers and regions may be enlarged or reduced to clearly illustrate their arrangements and relative positions.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

In the drawings, a term x used to express a direction represents a first direction, a term y indicates a second direction that is perpendicular to the first direction, and a term z denotes a third direction that is perpendicular to the first direction and the second direction.

A display device according to exemplary embodiments of the present inventive concept will now be described with reference to accompanying drawings.

FIG. 1 shows a top plan view of a display device according to an exemplary embodiment.

Referring to FIG. 1, the display device includes a display panel 10, a flexible printed circuit film 20 attached to the display panel 10, and a drivers including an integrated circuit chip 30.

The display panel 10 includes a display area (DA) corresponding to a screen for displaying an image, and a non-display area (NA) which is provided to surround the display area (DA) and in which circuits and/or signal lines for generating and/or transmitting various signals applied to the display area (DA) are disposed. In FIG. 1, an inside and an outside of a quadrangle expressed with alternated long and short dash line correspond to the display area (DA) and the non-display area (NA), respectively.

Pixels PX are exemplarily disposed in a matrix in the display area (DA) of the display panel 10. Signal lines (not shown) such as scan lines (also referred to as gate lines), emission control lines, data lines, or driving voltage lines are disposed in the display area (DA). Each pixel PX is connected to a scan line, an emission control line, a data line, and a driving voltage line so it may receive a scan signal (also referred to as a gate signal), an emission control signal, a data signal, and a driving voltage from the signal lines.

The display area (DA) may include a touch sensor layer for sensing a contact or non-contact touch of a user. The display area (DA) having a quadrangular shape with corners that are rounded is shown, but the display area (DA) may have various shapes such as a polygon, a circle, or an oval in addition to the quadrangle.

A pad portion (PP) where pads for receiving signals from the outside of the display panel 10 is provided in the non-display area (NA) of the display panel 10. The pad portion (PP) may extend in a first direction (x) along an edge of the display panel 10. A flexible printed circuit film 20 is bonded to the pad portion (PP), and the pads of the flexible printed circuit film 20 may be electrically connected to the pads of the pad portion (PP).

Drivers for generating and/or processing various signals for driving the display panel 10 is provided in the non-display area (NA) of the display panel 10. The drivers may include a data driver for applying data signals to data lines, a scan driver for applying scan signals to scan lines, an emission driver for applying emission control signals to emission control lines, and a signal controller for controlling the data driver, the scan driver, and the emission driver. The scan driver and the emission driver may be integrated on the display panel 10, and they may be provided on respective sides or one side of the display area (DA). The data driver and the signal controller may be provided as an integrated circuit chip (i.e., a driving IC chip) 30, and the integrated circuit chip 30 may be mounted in the non-display area (NA) of the display panel 10. The integrated circuit chip 30 may be mounted on a flexible printed circuit film that may be connected to the display panel 10 and may be electrically connected to the display panel 10.

The display panel 10 includes an encapsulating layer (EN) for covering the display area (DA). The encapsulating layer seals the display area (DA) to prevent moisture or oxygen from permeating into the display panel 10. An edge of the encapsulating layer (EN) may be provided between an edge of the display panel 10 and the display area (DA). A dam member (DM) surrounding the display area (DA) is provided in the non-display area (NA). The dam member (DM) prevents a forming material of the encapsulating layer (EN), particularly an organic material, from overflowing to the outside of the display panel 10. The dam member (DM) may include at least one dam.

The display panel 10 includes a bending region (BR). The bending region (BR) may be provided in the non-display area (NA) between the display area (DA) and the pad portion (PP). The bending region (BR) may be provided to traverse the display panel 10 in a first direction (x). The display panel 10 may be bent with a predetermined curvature radius with respect to a bending axis in parallel to the first direction (x) in the bending region (BR). When the display panel 10 is a top emission type, the pad portion (PP) and the flexible printed circuit film 20 that are disposed outside of the bending region (BR) may be bent so that they may be provided to a rear side of the display panel 10. In the electronic device to which the display device is applied, the display panel 10 may be bent as described. The bending region (BR) may be bent with respect to one bending axis, and the bending region (BR) may be bent with respect to a plurality of bending axes. The bending region (BR) is shown to be provided in the non-display area (NA) in the drawing, but the bending region (BR) may be provided in the display area (DA) and the non-display area (NA), or in the display area (DA).

FIG. 2, FIG. 3, FIG. 4, and FIG. 5 show cross-sectional views with respect to a line A-A' of FIG. 1 according to an exemplary embodiment.

A cross-sectional structure of the display panel 10 will be described in detail with reference to FIG. 2, and exemplary embodiments of FIG. 3, FIG. 4, and FIG. 5 will be described by focusing on differences from an exemplary embodiment of FIG. 2.

Figure 2:
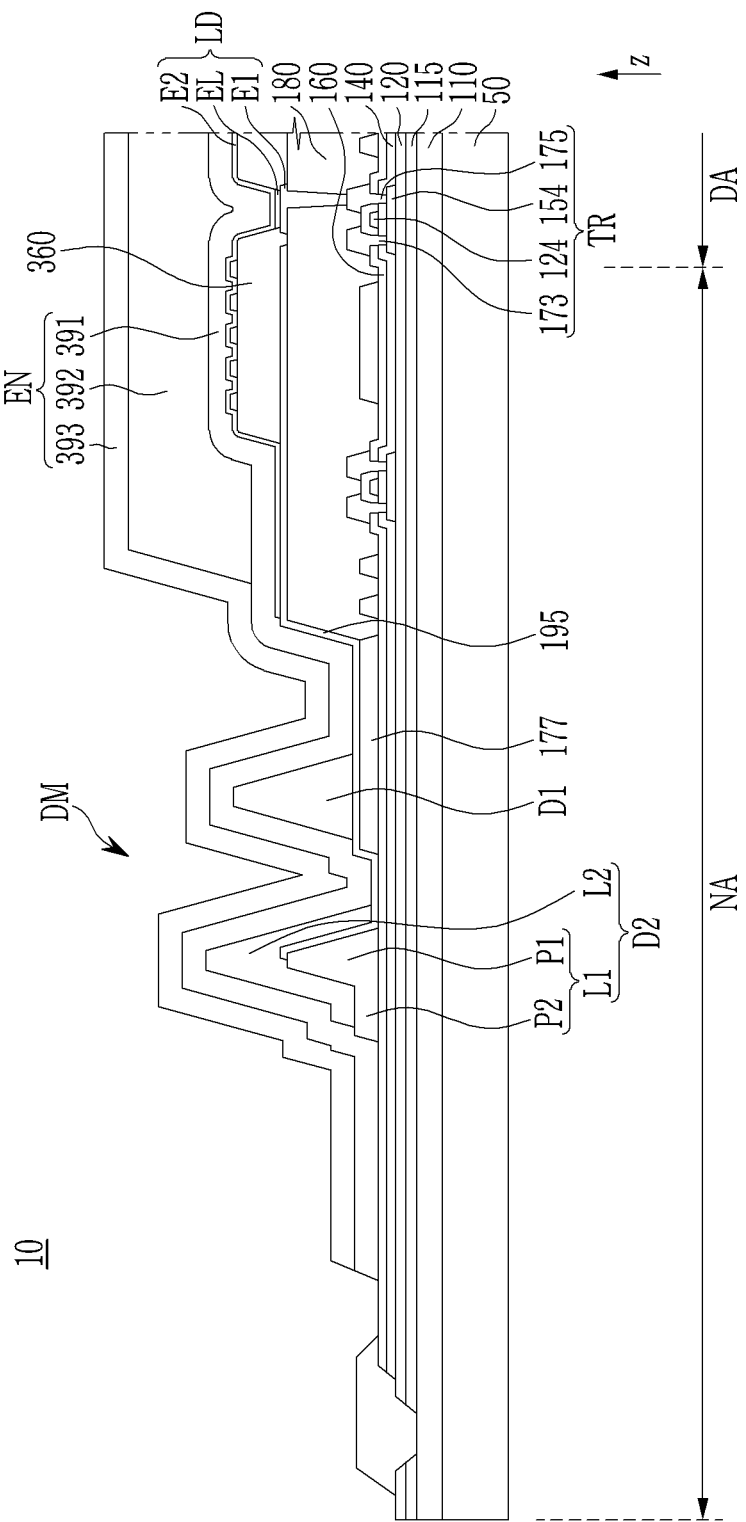
FIG. 2, FIG. 3, FIG. 4, and FIG. 5 show cross-sectional views with respect to a line A-A' of FIG. 1 according to an exemplary embodiment.

Referring to FIG. 2, a cross-section around a left edge of the display panel 10 is shown. A right edge portion of the display panel 10 may have a cross-sectional structure that is substantially symmetric with a left edge portion.

The display panel 10 includes a substrate 110 and a plurality of layers, wires, and elements formed thereon. A plurality of pixels are disposed in the display area (DA) of the display panel 10, and to avoid the complexity of the drawings, one pixel will be briefly illustrated. Further, each pixel includes transistors, a capacitor, and a light-emitting element, and a stacked structure of the display panel 10 will now be described, focusing on one transistor TR and one light-emitting element LD connected thereto.

The substrate 110 may be a flexible substrate. The substrate 110 may be made of a polymer such as a polyimide, a polyamide, a polycarbonate, or polyethylene terephthalate.

A barrier layer 115 for preventing permeation of external moisture is provided on the substrate 110. The barrier layer 115 may include an inorganic insulating material such as a silicon oxide ($SiO_x$) or a silicon nitride ($SiN_x$).

A buffer layer 120 is provided on the barrier layer 115. The buffer layer 120 may block an impurity that may penetrate to a semiconductor layer 154 from the substrate 110, and may reduce a stress applied to the substrate 110 in a process for forming the semiconductor layer 154. The buffer layer 120 may include an inorganic insulating material such as a silicon oxide or a silicon nitride.

A semiconductor layer 154 of a transistor (TR) is provided on the buffer layer 120. The semiconductor layer 154 includes a channel region overlapping the gate electrode 124 and a source region and a drain region disposed on either sides of the gate electrode 124 and doped with impurities. The semiconductor layer 154 may include a polysilicon, an amorphous silicon, or an oxide semiconductor.

A first insulating layer 140 including an inorganic insulating material such as a silicon oxide or a silicon nitride is provided on the semiconductor layer 154. The first insulating layer 140 may be referred to as a gate insulating layer.

A gate conductor including a scan line and a gate electrode 124 of the transistor (TR) is provided on the first insulating layer 140. The gate conductor may include a metal such as molybdenum (Mo), copper (Cu), aluminum (Al), silver (Ag), chromium (Cr), tantalum (Ta), or titanium (Ti), or a metal alloy thereof.

A second insulating layer 160 is provided on the first insulating layer 140 and the gate conductor. The second insulating layer 160 may include an inorganic insulating material such as a silicon oxide or a silicon nitride. The second insulating layer 160 may be referred to as an interlayer insulating layer.

A data conductor including a data line, a driving voltage line, a voltage transmitting line 177, and a source electrode 173 and a drain electrode 175 of a transistor (TR) is provided on the second insulating layer 160. The source electrode 173 and the drain electrode 175 may be connected to a source region and a drain region of the semiconductor layer 154 through contact holes formed in the second insulating layer 160 and the first insulating layer 140. The voltage transmitting line 177 may transmit a common voltage (ELVSS). The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and tantalum (Ta), or a metal alloy thereof. The data conductor may be multiple layers such as titanium/aluminum/titanium (Ti/Al/Ti), titanium/copper/titanium (Ti/Cu/Ti), or molybdenum/aluminum/molybdenum (Mo/Al/Mo).

The gate electrode 124, the source electrode 173, and the drain electrode 175 form a transistor (TR) together with the semiconductor layer 154. Regarding the shown transistor (TR), the gate electrode 124 is provided above the semiconductor layer 154, and the configuration of the transistor is not limited thereto and it may be modifiable in various ways.

A third insulating layer 180 is provided on the second insulating layer 160 and the data conductor. The third insulating layer 180 may include an organic insulating material, and for example, it may include a polyimide, an acryl-based polymer, or a siloxane-based polymer.

A first electrode E1 of the light-emitting element LD is provided on the third insulating layer 180. The first electrode E1 may be connected to the drain electrode 175 through a contact hole formed in the third insulating layer 180. A connecting member 195 connected to the voltage transmitting line 177 is provided on the third insulating layer 180. To connect the connecting member 195 and the voltage transmitting line 177, part of the third insulating layer 180 overlapping the voltage transmitting line 177 is removed. The connecting member 195 that is a conductive layer may be formed with a same material in a same process as the first electrode E1. The first electrode E1 and the connecting member 195 may include a metal such as silver (Ag), nickel (Ni), gold (Au), platinum (Pt), aluminum (Al), copper (Cu), aluminum neodymium (AlNd), or aluminum nickel lanthanum (AlNiLa), or a metal alloy thereof. The first electrode E1 and the connecting member 195 may include a transparent conductive material such as an indium tin oxide (ITO) or an indium zinc oxide (IZO). The first electrode E1 and the connecting member 195 may be formed of multiple layers such as ITO/silver(Ag)/ITO or ITO/aluminum (Al).

A fourth insulating layer 360 including an opening overlapping the first electrode E1 is provided on the third insulating layer 180. The opening of the fourth insulating layer 360 may define each pixel area, and may be referred to as a pixel defining layer. The fourth insulating layer 360 may include an organic insulating material.

An emission layer (EL) is provided on the first electrode E1, and a second electrode E2 is provided on the emission layer (EL). The second electrode E2 is connected to the connecting member 195. The connecting member 195 is connected to the voltage transmitting line 177, so the second electrode E2 is electrically connected to the voltage transmitting line 177 through the connecting member 195 and may receive a common voltage (ELVSS). The second electrode E2 may be allowed to have a light transmission property by forming a thin layer with a metal having a low work function such as calcium (Ca), barium (Ba), magnesium (Mg), aluminum (Al), or silver (Ag). The second electrode E2 may be formed of a transparent conductive material such as an ITO or an IZO. The first electrode E1, the emission layer (EL), and the second electrode E2 of each the pixel configure a light-emitting element LD such as an organic light emitting diode.

An encapsulating layer (EN) is provided on the second electrode E2. The encapsulating layer (EN) may seal the light-emitting element LD to prevent external moisture or oxygen from permeating. The encapsulating layer (EN) is formed by stacking at least one inorganic layer and at least one organic layer. In the shown exemplary embodiment, the encapsulating layer (EN) is a thin-film encapsulating layer including a first inorganic layer 391, a second inorganic layer 393, and an organic layer 392 provided therebetween. The first inorganic layer 391 and the second inorganic layer 393 covering a lateral surface of the organic layer 392 are formed to be wider than the organic layer 392, and the first inorganic layer 391 may contact the second inorganic layer 393 in an edge region of the encapsulating layer (EN). The organic layer 392 may include an acryl-based resin, a methacrylate-based resin, an isoprene-based resin, a vinyl-based resin, an epoxy-based resin, a urethane-based resin, a cellulose-based resin, and a perylene-based resin.

A polarization layer (not shown) for reducing reflection of external light may be provided on the encapsulating layer (EN), and a touch sensor layer (not shown) including touch electrodes for sensing a touch may be provided between the encapsulating layer (EN) and the polarization layer.

A dam member (DM) is provided on the second insulating layer 160 in the non-display area (NA). The dam member (DM) may prevent an organic material such as a monomer from overflowing when the organic layer 392 of the encapsulating layer (EN) is formed, and hence, an edge of the organic layer 392 of the encapsulating layer (EN) may be generally provided to an inner side of the dam member (DM), that is, between the dam member (DM) and the display area (DA). The first inorganic layer 391 and the second inorganic layer 393 forming the encapsulating layer (EN) may be formed to extend above a first dam D1 and a second dam D2. In this case, a contact area of the first inorganic layer 391 and the second inorganic layer 393 may increase to increase adhesiveness between the first inorganic layer 391 and the second inorganic layer 393.

The dam member (DM) may include the first dam D1 and the second dam D2. The first dam D1 may be provided nearer the display area (DA) than the second dam D2. The second dam D2 may be formed to be higher than the first dam D1. The first dam D1 may be formed to be at least one layer. The first dam D1 may be formed with a same material in the same process as the fourth insulating layer 360. A lower surface of the first dam D1 may contact the connecting member 195 or may contact the second insulating layer 160. The second dam D2 may include a plurality of layers. The second dam D2 may include a first layer L1 and a second layer L2 provided thereon. The connecting member 195 may be provided between the first layer L1 and the second layer L2. The first layer L1 may be formed with a same material in the same process as the third insulating layer 180. A lower surface of the first layer L1 may contact the second insulating layer 160. The second layer L2 may be formed with a same material in the same process as the fourth insulating layer 360. Therefore, the first dam D1, the second layer L2 of the second dam D2 and the fourth insulating layer 360 may be formed together by forming an organic insulating material and patterning the same. In this instance, when the second layer L2 includes a portion contacting the second insulating layer 160, the corresponding portion of the second layer L2 may lift. This lifting is generated because the second insulating layer 160 that is an inorganic layer is hydrophilic and the second layer L2 that is an organic layer is hydrophobic, and interface adhesion of the second layer L2 and the second insulating layer 160 is accordingly weak. In another way, the first dam D1 may be formed with a material that is different from the second layer L2 of the second dam D2, or it may be formed in another process.

To remove or minimize the portion where the second layer L2 contacts the second insulating layer 160, the first layer L1 includes two portions P1 and P2 having different heights, like a step. That is, the first layer L1 has two portions including a relatively high first portion P1 and a relatively low second portion P2. The second portion P2 may be provided to an outside of the first portion P1, that is, it may be provided to be distant from the display area (DA). When the first layer L1 is formed in this manner, a portion of the second layer L2 that may contact the second insulating layer 160 when the second portion P2 does not exist may be provided on a second portion P2 of the first layer L1 to prevent the second layer L2 from contacting the second insulating layer 160. The second layer L2 may cover a lateral surface and an upper surface of the first portion P1, and it may cover at least part of an upper surface of the second portion P2. As described, when the second dam D2 is formed, the second layer L2 that is an organic layer is provided on the first layer L1 that is an organic layer, thereby preventing the second layer L2 from lifting by increasing the adhesiveness of the second layer L2 to a lower layer, the first layer L1.

The first portion P1 and the second portion P2 having different heights may be formed by using a halftone mask. When a photolithography process for forming the second layer L2 is performed, it is possible to build an additional bridge between organic layers (the first layer L1 and the second layer L2) during a soft bake, so adhesiveness of the second layer L2 may be further increased.

A passivation film 50 for protecting the display panel 10 is provided below the display panel 10. The passivation film 50 may be attached to a rear side of the display panel 10 by an adhesive. The passivation film 50 may be made of a plastic such as polyethylene terephthalate, polyethylene naphthalate, polyimide, or polyethylene sulfide.

Figure 3:
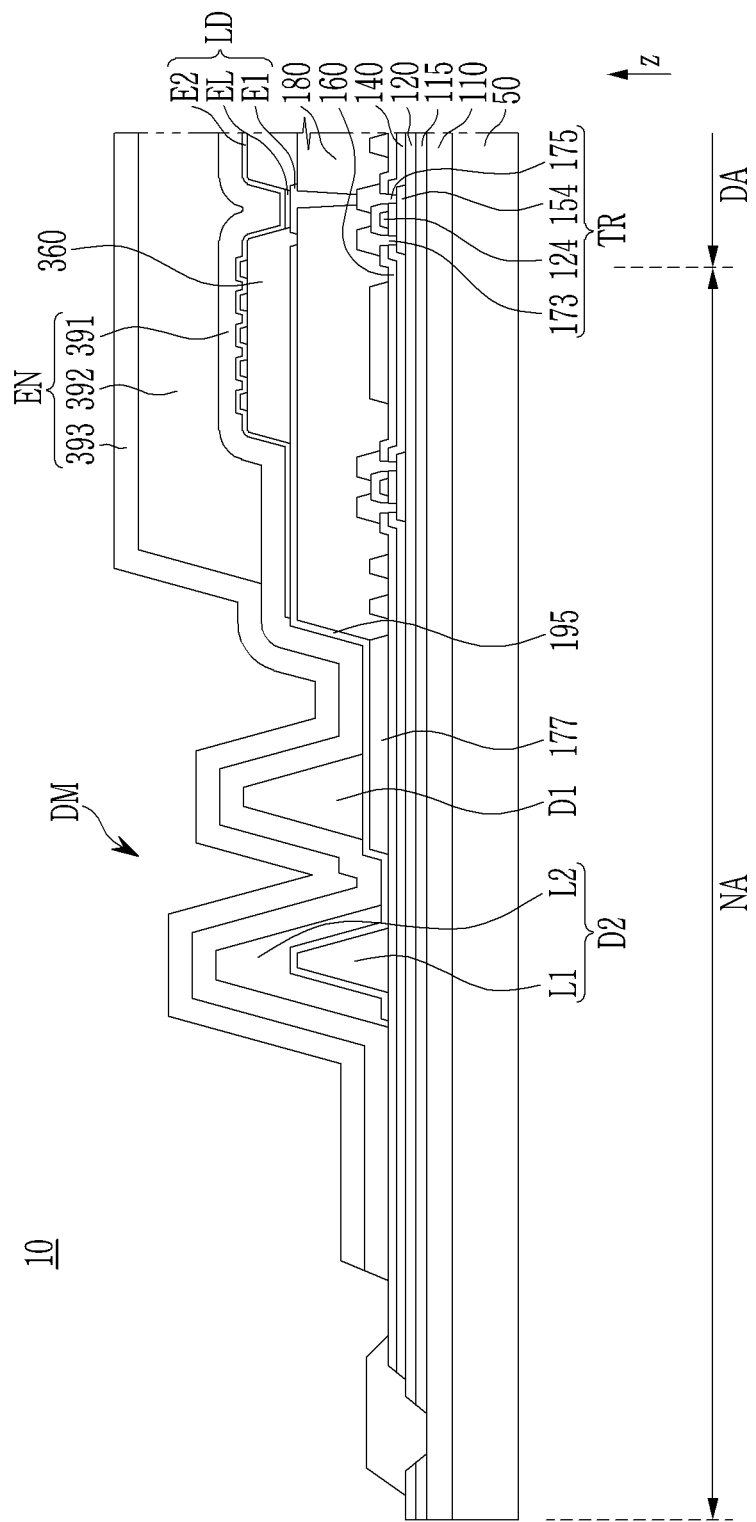

Referring to FIG. 3, the connecting member 195 between the first layer L1 and the second layer L2 in the second dam D2 covers an internal surface (a lateral surface facing the display area (DA)) of the first layer L1, an upper surface, and an external surface (a lateral surface facing an opposite side of the display area (DA)), and extends to completely pass through the first layer L1. The second layer L2 of the second dam D2 provided on the first layer L1 and the connecting member 195 cover the internal surface, the upper surface, and the external surface of the first layer L1. The second layer L2 covers an end portion of the connecting member 195, and a lower surface of the second layer L2 includes a portion contacting the second insulating layer 160 that is an inorganic layer and it mostly contacts the connecting member 195. The conductive layer such as an ITO or a metal and the organic layer have excellent interface adhesion, so the second layer L2 that is an organic layer does not lift from the connecting member 195 that is a conductive layer. As described, when the second dam D2 and the connecting member 195 are formed, a portion in which the lower surface of the second layer L2 contacts the second insulating layer 160 that is an inorganic layer may be minimized, thereby preventing the second layer L2 from lifting.

Figure 4:
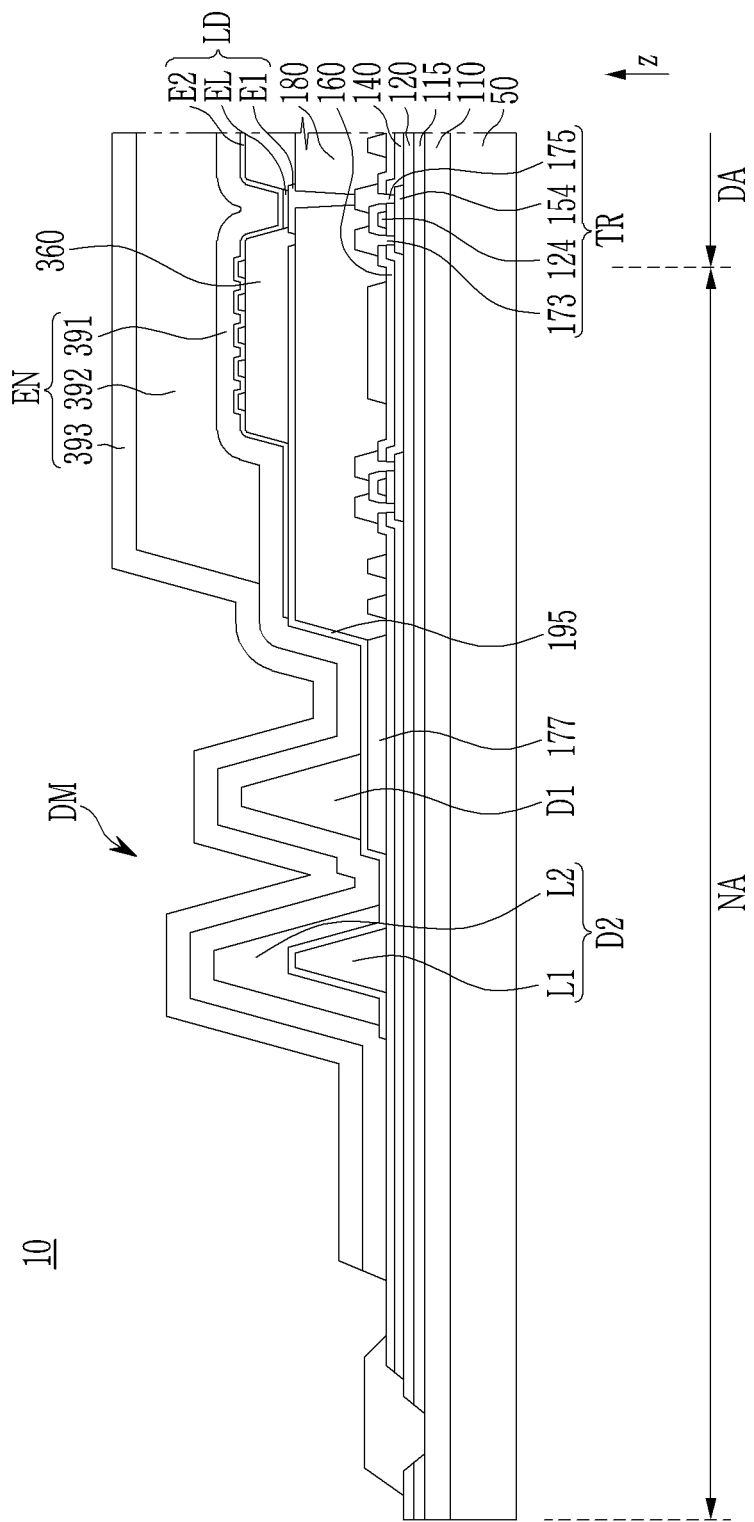

Referring to FIG. 4, the connecting member 195 provided between the first layer L1 and the second layer L2 extends to pass through the second dam D2. That is, the connecting member 195 protrudes to respective sides of the second layer L2. In this case, the lower surface of the second layer L2 does not contact the second insulating layer 160 but contacts the connecting member 195, thereby preventing the second layer L2 from lifting.

Figure 5:
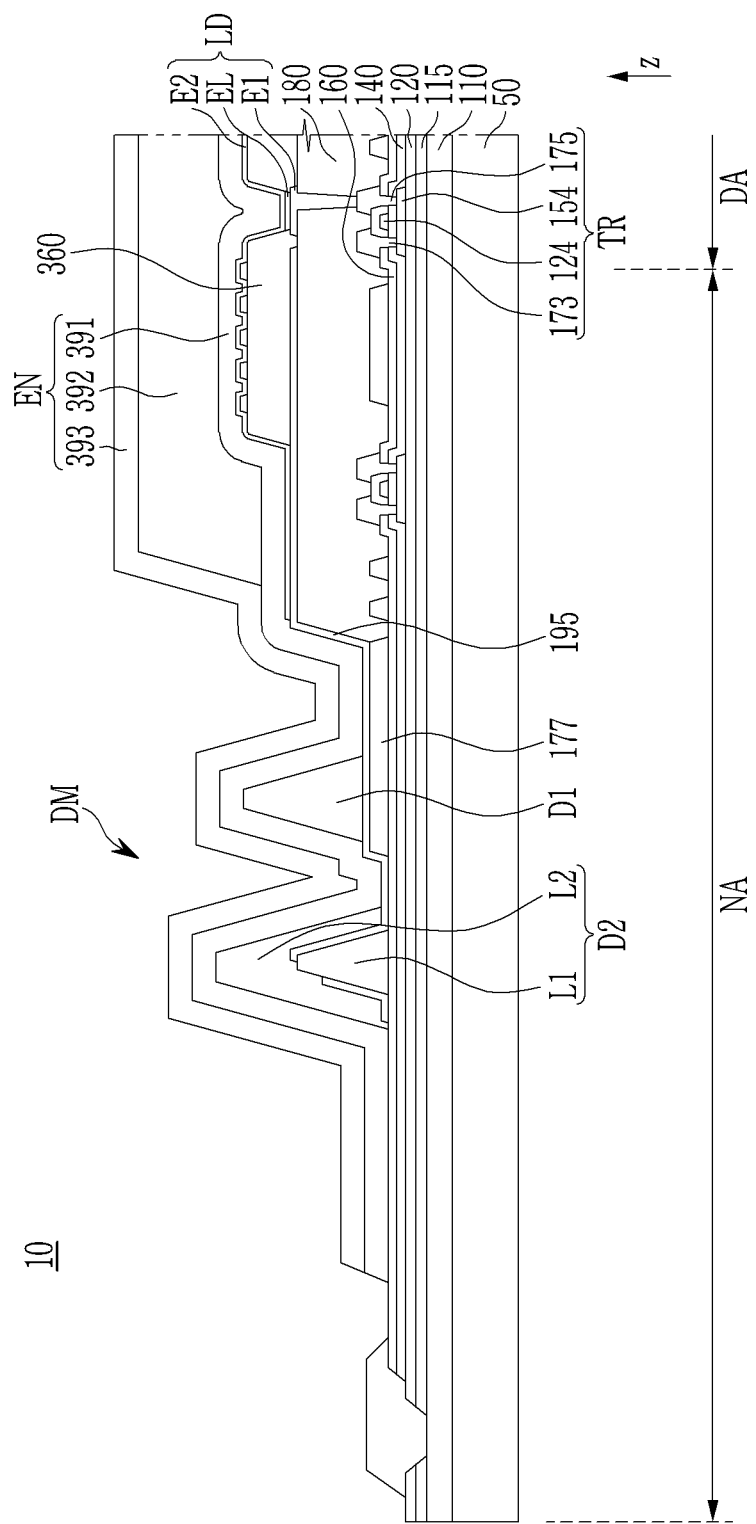

Referring to FIG. 5, compared to an exemplary embodiment of FIG. 3, a connecting member 195 between the first layer L1 and the second layer L2 is discontinuously formed. That is, the connecting member 195 is disconnected between the first layer L1 and the second layer L2. However, the connecting member 195 is provided between the second insulating layer 160 and the lower surface of the second layer L2, so the second layer L2 may be prevented from lifting by minimizing a portion where the lower surface of the second layer L2 contacts the second insulating layer 160 that is an inorganic layer.

Figure 6:
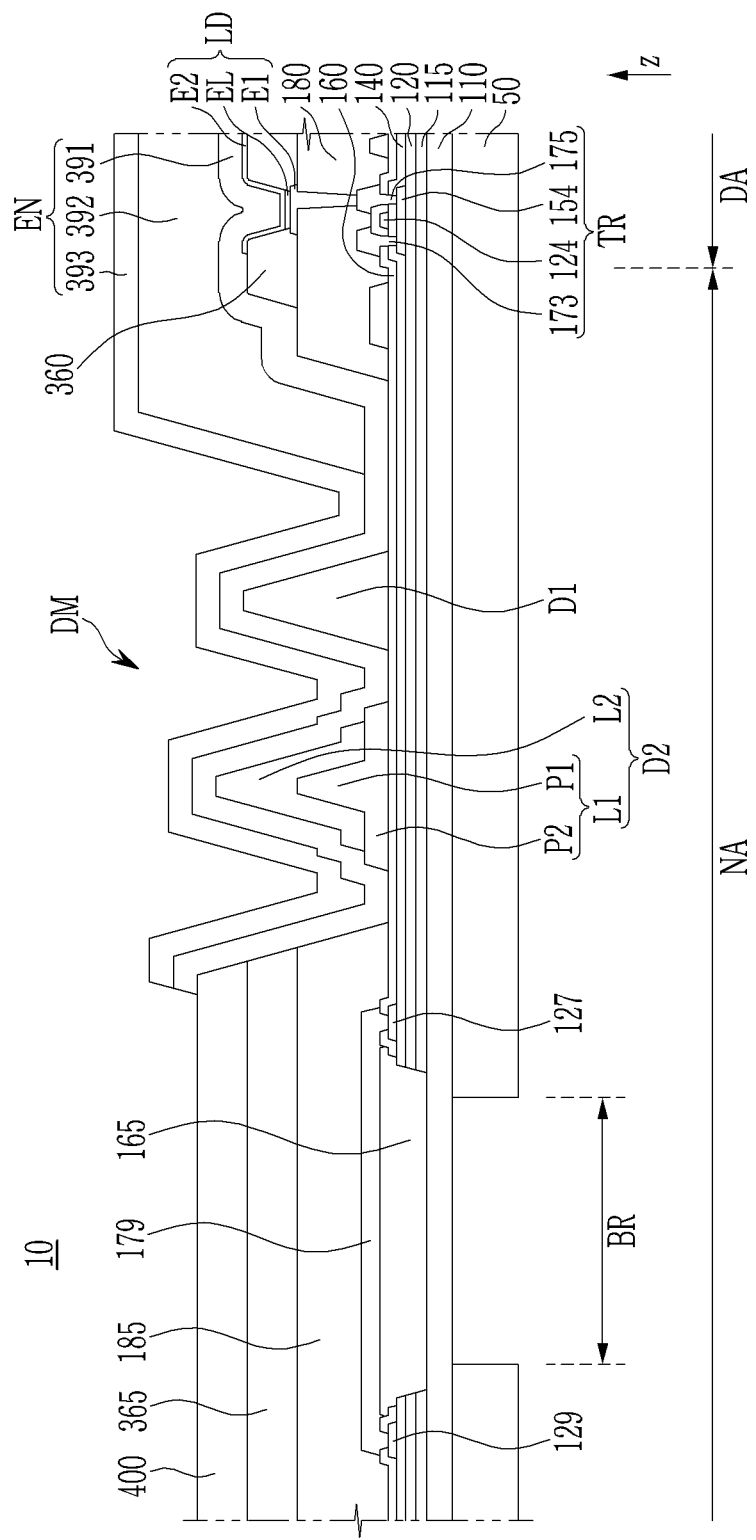
FIG. 6, FIG. 7, and FIG. 8 show cross-sectional views with respect to a line B-B' of FIG. 1 according to an exemplary embodiment.
Figure 7:
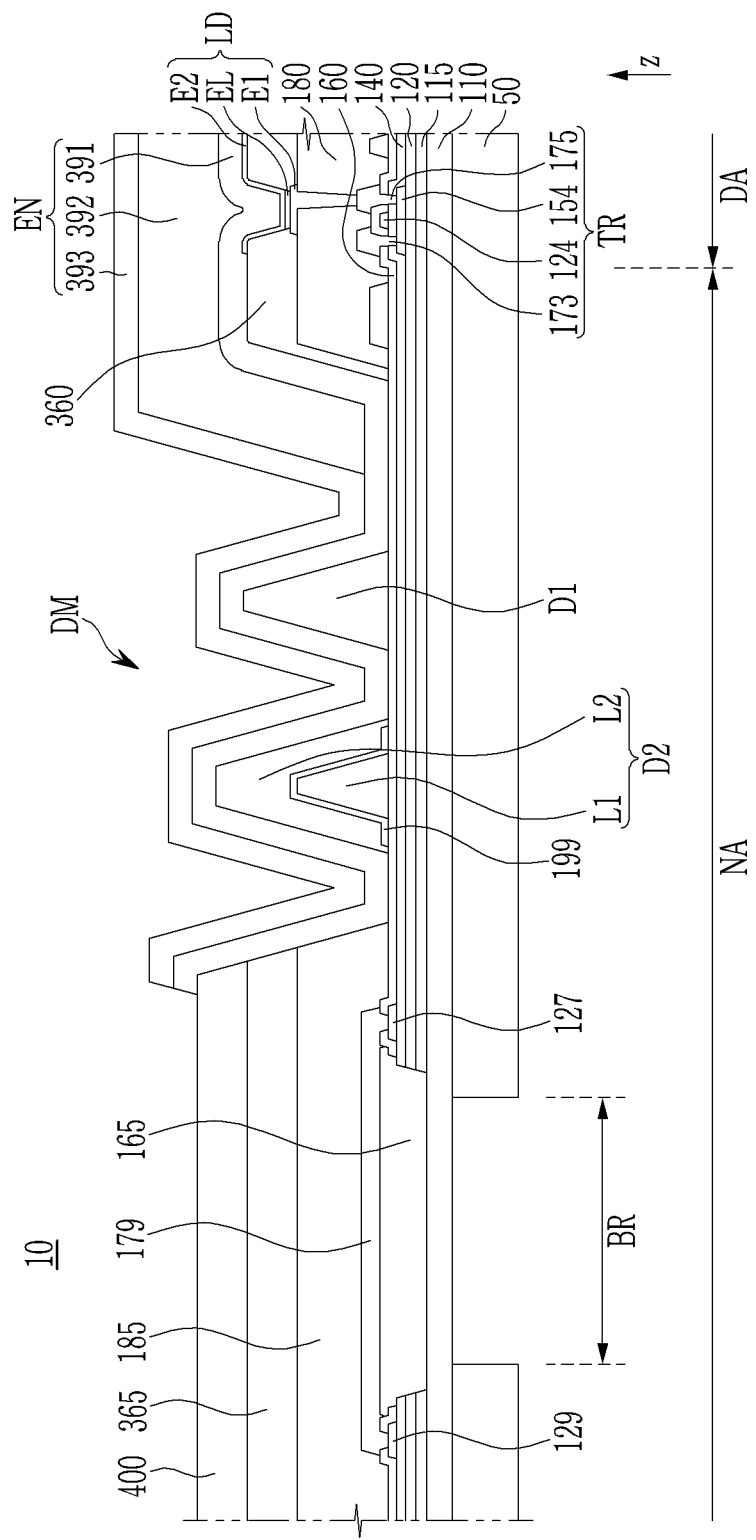
Figure 8:
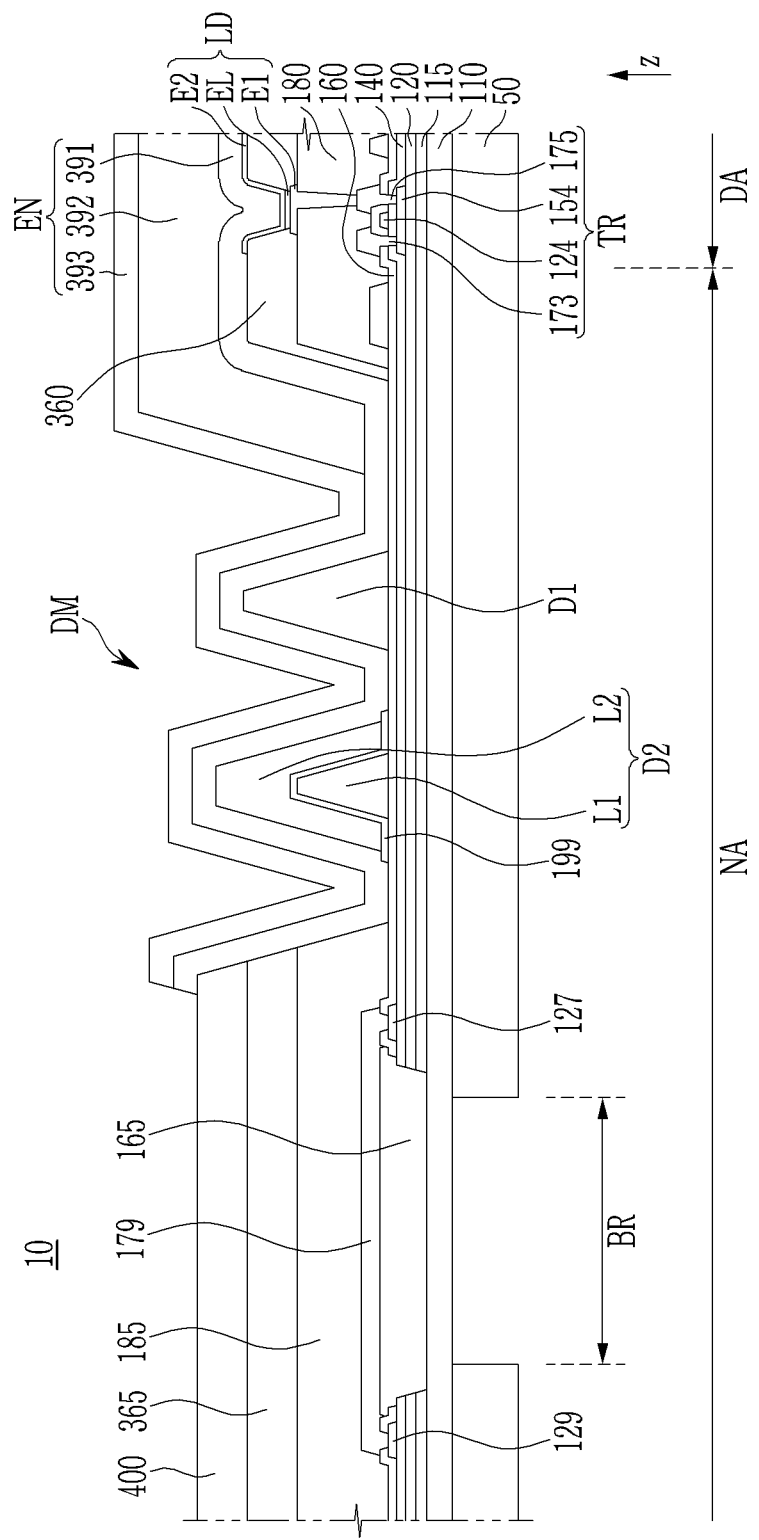

FIG. 6, FIG. 7, and FIG. 8 show cross-sectional views with respect to a line B-B' of FIG. 1 according to an exemplary embodiment.

The above-described FIG. 2 to FIG. 5 show cross-sectional diagrams on a left edge of the display panel 10, and FIG. 6 to FIG. 8 show cross-sectional views on an edge where a pad portion (PP) of the display panel 10 is provided. Differences from an exemplary embodiment of FIG. 2 will now be described with reference to FIG. 6.

Referring to FIG. 6, a dam member (DM) surrounds the display area (DA), so a first dam D1 and a second dam D2 are provided around a lower edge where the pad portion (PP) of the display panel 10 is provided. The voltage transmitting line 177 shown in FIG. 2 may not be provided around the lower edge of the display panel 10, and hence, a connecting member 195 for electrically connecting the voltage transmitting line 177 and the second electrode E2 may not be provided. The lower surface of the first dam D1 may contact the second insulating layer 160, and the lower surface of the first layer L1 of the second dam D2 may contact the second insulating layer 160. To prevent the second layer L2 of the second dam D2 from contacting the second insulating layer 160, the first layer L1 includes a first portion P1 and a second portion P2 which have different height each other. The relatively low second portion P2 protrudes on respective sides of the relatively high first portion P1. The second layer L2 covers a lateral surface and an upper surface of the first portion P1, and covers at least part of an upper surface of the second portion P2. As described, the second layer L2 may be prevented from lifting by increasing the adhesiveness of the second layer L2 when the second dam D2 is formed. The first portion P1 and the second portion P2 with different heights may be formed by using a halftone mask.

Regarding the bending region (BR), a connecting wire 179 for electrically connecting a first wire 127 and a second wire 129 provided on respective sides is provided in the bending region (BR). Therefore, signals (e.g., a data signal, a control signal, and a voltage signal) output by the integrated circuit chip 30, and signals (e.g., a driving voltage (ELVDD) and a common voltage (ELVSS)) input to a pad of the pad portion (PP) may be transmitted to the display area (DA) and the drivers through the second wire 129, the connecting wire 179, and the first wire 127. The connecting wire 179 is bent when the bending region (BR) is bent, so it may be formed with a metal that is flexible and has an excellent Young's modulus. The connecting wire 179 may be formed of a same material in the same process as the source electrode 173 and the drain electrode 175. When the flexibility of the connecting wire 179 increases, a stress on the strain of the connecting wire 179 reduces, so the risks of degradation (e.g., generation of cracks) or disconnection of the connecting wire 179 may be reduced.

In the bending region (BR), a first protection layer 165 is provided between the substrate 110 and the connecting wire 179. The first protection layer 165 may include an organic insulating material such as a polyimide, an acryl-based polymer, or a siloxane-based polymer. A second protection layer 185 and a third protection layer 365 are provided on the connecting wire 179. The second protection layer 185 may be formed of a same material in the same process as the third insulating layer 180. The third protection layer 365 may be formed of a same material in the same process as the fourth insulating layer 360. A bending protection layer 400 for lessening a tensile stress and protecting the connecting wire 179 is provided on the third protection layer 365. The bending protection layer 400 may be referred to as a stress neutralization layer. The bending protection layer 400 may include an organic insulating material such as an acryl resin.

The barrier layer 115 that is an inorganic insulating layer including an inorganic insulating material, the buffer layer 120, the first insulating layer 140, and the second insulating layer 160 may be removed from the bending region (BR). This is because the inorganic insulating layer may be easily cracked when it is bent, and wires may be damaged by the cracking.

The passivation film 50 is provided to cover a rear side of the display panel 10, but it is not provided in the bending region (BR) so as to reduce a bending stress of the bending region (BR). The passivation film 50 may be formed by attaching a passivation film on an entire rear side of the display panel 10 and removing a passivation film portion provided in the bending region (BR).

An exemplary embodiment shown with reference to FIG. 7 and FIG. 8 is different from an exemplary embodiment shown with reference to FIG. 6, regarding the structure of the second dam D2. Referring to FIG. 7, a conductive layer 199 is provided between the first layer L1 and the second layer L2 on the second dam D2. The conductive layer 199 covers an internal surface (a lateral surface provided toward the display area (DA)), an upper surface, and an external surface (a lateral surface provided toward an opposite side of the display area (DA)) of the first layer L1, and it extends to respective sides of the first layer L1. The second layer L2 of the second dam D2 provided on the first layer L1 and the conductive layer 199 covers the internal surface, the upper surface, and the external surface of the first layer L1. The second layer L2 covers an end portion of the connecting member 195, and a lower side of the second layer L2 contacts the conductive layer 199. Referring to FIG. 8, the conductive layer 199 provided between the first layer L1 and the second layer L2 in the second dam D2 extends to pass through the second dam D2. That is, the conductive layer 199 protrudes to respective sides of the second layer L2. When the second dam D2 and the conductive layer 199 are formed as described above, the portion where the lower side of the second layer L2 does not contact the second insulating layer 160 that is an inorganic layer or contacts the same may be minimized, thereby preventing the second layer L2 from lifting.

The conductive layer 199 works to improve the adhesiveness of the second layer L2, and it is in an electrically floating state. The conductive layer 199 may be formed with a same material in the same process as the first electrode E1 of the light-emitting element LD.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a substrate including a display area and a non-display area around the display area;
a light-emitting element disposed in the display area;
an encapsulating layer sealing the light-emitting element;
a dam disposed in the non-display area; and
an additional dam disposed between the dam and the display area,
wherein the dam includes a first layer and a second layer on the first layer,
the first layer includes a first portion with a first height and a second portion with a second height that is less than the first height, and
the second layer covers a lateral surface of the first portion, and
wherein the additional dam includes a portion contacting a conductive layer disposed between the first layer and the second layer.

2. The display device of claim 1, further comprising
an inorganic insulating layer disposed between the substrate and the dam,
wherein the first layer contacts the inorganic insulating layer, and the second layer does not contact the inorganic insulating layer.

3. The display device of claim 2, further comprising
a voltage transmitting line disposed on the inorganic insulating layer in the non-display area,
wherein the conductive layer is connected to the voltage transmitting line.

4. The display device of claim 2, wherein
the conductive layer is in an electrically floating state.

5. The display device of claim 2, wherein
the light-emitting element includes a first electrode, an emission layer on the first electrode, and a second electrode on the emission layer, and
the conductive layer is formed to be a same layer with a same material as the first electrode.

6. The display device of claim 2, wherein
the additional dam is formed of a same material as the second layer.

7. The display device of claim 1, wherein
the second portion is positioned outside of the first portion.

8. The display device of claim 1, wherein
the second portion is disposed on respective sides of the first portion.

9. The display device of claim 1, wherein
the first layer and the second layer include an organic material.

10. The display device of claim 9, further comprising
a first organic insulating layer disposed between the substrate and the light-emitting element, and
a second organic insulating layer disposed between the first organic insulating layer and the encapsulating layer,
wherein the first layer is formed of a same material as the first organic insulating layer on a same plane, and the second layer is formed of a same material as the second organic insulating layer on a same plane.

11. The display device of claim 1, wherein
the encapsulating layer includes a first inorganic layer, a second inorganic layer, and an organic layer between the first inorganic layer and the second inorganic layer, and
the dam surrounds the display area, and the first inorganic layer and the second inorganic layer contacts each other on the dam.

12. A display device comprising:
a light-emitting element disposed in a display area on a substrate;
an encapsulating layer sealing the light-emitting element;
a connecting member disposed in a non-display area around the display area; and
a dam disposed in the non-display area, and including a first layer and a second layer on the first layer,
wherein the connecting member is disposed between the first layer and the second layer, and covers an internal surface, an upper surface, and an external surface of the first layer, and
the second layer covers the internal surface, the upper surface, and the external surface of the first layer, and
wherein the second layer covers an end portion of the connecting member.

13. A display device comprising:
a light-emitting element disposed in a display area on a substrate;
an encapsulating layer sealing the light-emitting element;
a connecting member disposed in a non-display area around the display area; and
a dam disposed in the non-display area, and including a first layer and a second layer on the first layer,
wherein the connecting member is disposed between the first layer and the second layer, and covers an internal surface, an upper surface, and an external surface of the first layer, and
the second layer covers the internal surface, the upper surface, and the external surface of the first layer, and
wherein the connecting member protrudes to respective sides of the dam.

14. The display device of claim 13, further comprising
an inorganic insulating layer disposed between the substrate and the dam,
wherein the first layer contacts the inorganic insulating layer, and the second layer does not contact the inorganic insulating layer.

15. The display device of claim 12, wherein
the connecting member has a portion that is disposed between the first layer and the second layer and is discontinuously formed.

16. The display device of claim 12, further comprising
a voltage transmitting line disposed in the non-display area and transmitting a common voltage,
wherein the connecting member is connected to the voltage transmitting line.

17. The display device of claim 12, further comprising
a first organic insulating layer disposed between the substrate and the light-emitting element, and
a second organic insulating layer disposed between the first organic insulating layer and the encapsulating layer,
wherein the first layer is formed of a same material as the first organic insulating layer on a same plane, and the second layer is formed of a same material as the second organic insulating layer on a same plane.

* * * * *